Jan. 13, 1970 C. A. PARKER ET AL 3,489,990

MULTIPURPOSE COUPLING DEVICE

Filed July 14, 1966 3 Sheets-Sheet 1

INVENTORS
DONALD R. JENSEN
CHARLES A. PARKER
BY David Teschner
ATTORNEY

Jan. 13, 1970 C. A. PARKER ET AL 3,489,990

MULTIPURPOSE COUPLING DEVICE

Filed July 14, 1966 3 Sheets-Sheet 2

INVENTORS
DONALD R. JENSEN
CHARLES A. PARKER
BY David Isaacson
ATTORNEY

MULTIPURPOSE COUPLING DEVICE

Filed July 14, 1966 3 Sheets-Sheet 3

INVENTORS
DONALD R. JENSEN
CHARLES A. PARKER
BY
ATTORNEY

United States Patent Office 3,489,990
Patented Jan. 13, 1970

3,489,990
MULTIPURPOSE COUPLING DEVICE

Charles A. Parker, East Orange, and Donald R. Jensen, Bloomsbury, N.J., assignors to Litton Business Systems, Inc., a corporation of New York Filed July 14, 1966, Ser. No. 565,132
Int. Cl. H01r *13/50, 13/54*
U.S. Cl. 339—75 13 Claims

ABSTRACT OF THE DISCLOSURE

A connector is provided comprising an outer channel of semirigid material, an inner channel of resilient material, and a locking bar placed between the inner and outer channel. A printed circuit board and a flexible ribbon cable are inserted into the inner channel and locked into contact by rotation of the locking bar.

This invention pertains to a multipurpose coupling device and more particularly to a novel form of coupling device for coupling printed circuit boards to flexible multiconductor ribbon cables with provision for support of the printed circuit board within a housing as well as provision for the locking within said housing and the rotation of said board with respect to said housing for servicing.

With the increased complexity of modern day electronic equipment systems and the ever increasing complexity of these systems it is often necessary to provide interconnection between a great number of printed circuit boards and their components with other related elements of the over-all electronic system. The present day techniques require that these printed circuit boards be made easily removable from their connectors for rapid change as a result of the failure of components or over-all circuits and further require that these boards be positionable so as to permit the servicing of the components upon the board or the testing of the circuits in which the components are found on either face of the board.

Present techniques to accomplish these purposes generally require a number of separate systems united into a single unit. A first of these is the connector itself which is required to connect individual wires to the conductors of the printed circuit boards leading to the components thereon. These connectors are usually found to have spring loaded fingers to effect the connection between the connectors and the conductors of the printed circuit board. The connectors themselves must then be individually wired to the input or output cable or wires. Due to the trend towards miniaturization of the elements themselves, the amount of spacing in the connectors for such fittings and wiring is extremely limited and great care must be taken so as to prevent shorts and other destructive practices with respect to the connector. In addition, in order to permit the circuit board to be supported a supporting framework must be provided which framework must be provided with sliding or pivotal means to permit the board to be displaced from a use position to a service position. This framework must also allow the board to be easily removed and reinserted into the connector without destruction to the connector itself. It has been found in practice that the continual insertion and removal of such printed circuit boards often leads to the weakening of the spring loaded fingers of the connector such that intermittent or improper connections will be made. Additional care must be taken in the wiring of these connectors associated with a board to be moved, such that the motion of the board does not strain or destroy the wiring to the connectors themselves.

Devices of the prior art have attempted to solve various portions of the problems set forth above but none has attempted to solve the entire problem. In certain of the prior art devices, the connector assembly is made in two parts and brought into contact with the printed circuit board upon insertion thereof by movement of a locking means. Although this decreases the possible strain upon the spring loaded fingers of the connector, it still requires individual wiring of the connectors themselves. Cumbersome structures are employed in the prior art to provide a rotatable shelf-type frame and support member for the printed circuit board so that it may be swung from a use position to a service position, with provision for the removal from the chassis in which the board is located. Such structures often require guide rails, roller bearing mountings, etc., to permit the rotation of the printed circuit board and its removal and insertion, and its support during the time of use.

The present invention overcomes many of the difficulties noted with respect to the prior art by providing a simple unitary structure which provides the functions of a connector, a supporting member for holding the board in position, for facilitating its removal and insertion into the connector, provides locking means to hold the printed circuit board in its desired use position, and ease of unlocking so that the board may be rotated to a service position and further eliminates the need for individual wiring of the portions of the connector. The connector is designed to bring into operative relationship the individual conductors of a multiconductor printed circuit board with the individual conductors of a flexible ribbon cable thus eliminating the need for individual wiring of the connector. The connector is fabricated in such a manner that in a released position the printed circuit board together with the flexible ribbon cable wrapped about its bottom or conductor end may be freely inserted or removed from the connector or to permit the removal of the printed circuit board without disturbing the flexible ribbon cable. In the operated position pressure is brought to bear such as to hold the individual conductors of the flexible ribbon cable in contact with the conductors of the printed circuit board to assure intimate contact and to hold the board in place.

The connector is fabricated from an outer channel of semi-rigid material, an inner channel of flexible material which is lined with a resilient material and a rotatable locking bar is placed in the position between the inner channel and the outer channel. The printed circuit board with the flexible ribbon cable wound about its bottom or conductor end is then inserted into the inner channel within the resilient lining thereof. This action causes a slight wiping of the surfaces of the conductors of the flexible ribbon cable against the conductors of the printed circuit board to remove surface dirt and oxide formations. This wiping action will also take place upon the insertion of a printed circuit board within the flexible ribbon cable despite the cable already being positioned within the inner channel due to the force exerted by the resilient liner. Locating pins are provided in the connector so that the printed circuit board is restricted in its lateral movement, that is movement along the length of the connector, and also as to limit its degree of penetration into the connector to prevent possible rupturing or abrasion of the flexible ribbon cable. Notches are provided in the outer walls of the outer channel so as to accurately position the flexible ribbon cable with respect to the connector. The locking bar is then moved to its operating position so as to force into intimate contact the conductors of the flexible ribbon cable and the contact conductors of the printed circuit board. This is accomplished by the transmittal of force from the locking bar through the flexible inner channel and the compression of the resilient liner of the inner channel. Variations of a minor nature in the flexible ribbon cable or the printed circuit board can be evened out or averaged out by the relative compression of the resilient means along the inner channel. Greater disturbances such as warpage of the board will be taken care of by the resilient effects of the semi-rigid channel thereby providing for a uniform average application of force along the entire length of the conductor.

By the inclusion of support members, coupled directly to the ends of the outer channel of the connector, which include support means along the support members, the printed circuit board can be supported and positioned with respect to the connector during insertion and removal of the printed circuit board therefrom. The entire circuit board together with the support members is then placed inside a support housing wherein the extension of the locking bar acts as a pivot point for the entire connector together with the printed circuit board and support members. Extendible locking brackets on the printed circuit board then cooperate with apertures within the support members and support housing to provide for the locking of the printed circuit board and its connector in a given position. By staggering the pivotal positions of the respective boards a plurality of these boards may be placed in a single support housing. By providing the support means attached to the supporting members with extension lips, rest positions or separators may be provided such that the components of the printed circuit boards are not permitted to touch either the frame of the support housing or one another. It is, therefore, an object of this invention to provide an improved form of multipurpose coupling device.

It is yet another object of this invention to provide an improved form of connector for coupling printed circuit board to flexible ribbon cables.

It is yet another object of this invention to provide an improved form of connector for coupling printed circuit boards and the conductors of flexible ribbon cables in such a manner that uniform force may be applied along the entire length of the connector.

It is yet another object of this invention to provide an improved form of connector wherein during a nonoperated cycle the connector is in an expanded position to readily accept or allow the removal of a printed circuit board and flexible ribbon cable and when in an operated position to prevent such insertion and removal and to cause intimate contact between the individual conductors of the flexible ribbon cable and the conductors of the printed circuit board.

It is still another object of this invention to provide an improved form of coupling device which also includes a support framework for supporting the printed circuit board within the connector and which further provides a positioning channel to permit the rapid insertion and removal of the printed circuit board from the connector.

It is yet another object of this invention to provide a housing for a multipurpose coupling device wherein the locking bar of the connector may be employed as a pivot member for moving the printed circuit board within said housing from a position of use to a servicing position.

It is yet another object of this invention to provide a simple, inexpensive, easily fabricated multipurpose connecting device which provides for the functions of connecting a printed circuit board to a flexible ribbon cable as well as providing for the support of such printed circuit board while in the connector and facilitates the insertion and removal therefrom and which provides for the movement of said connector and printed circuit board with respect to a support housing and provides locking means for retaining the printed circuit board and connector within said housing.

Other objects and features of the invention will be pointed out in the following description and claims and illustrated in the accompanying drawings, which disclose, by way of example, the principles of the invention, and the best modes which have been contemplated for carrying it out.

In the drawings.

Similar elements will be given similar reference characters in each of the respective figures.

Figure 1:
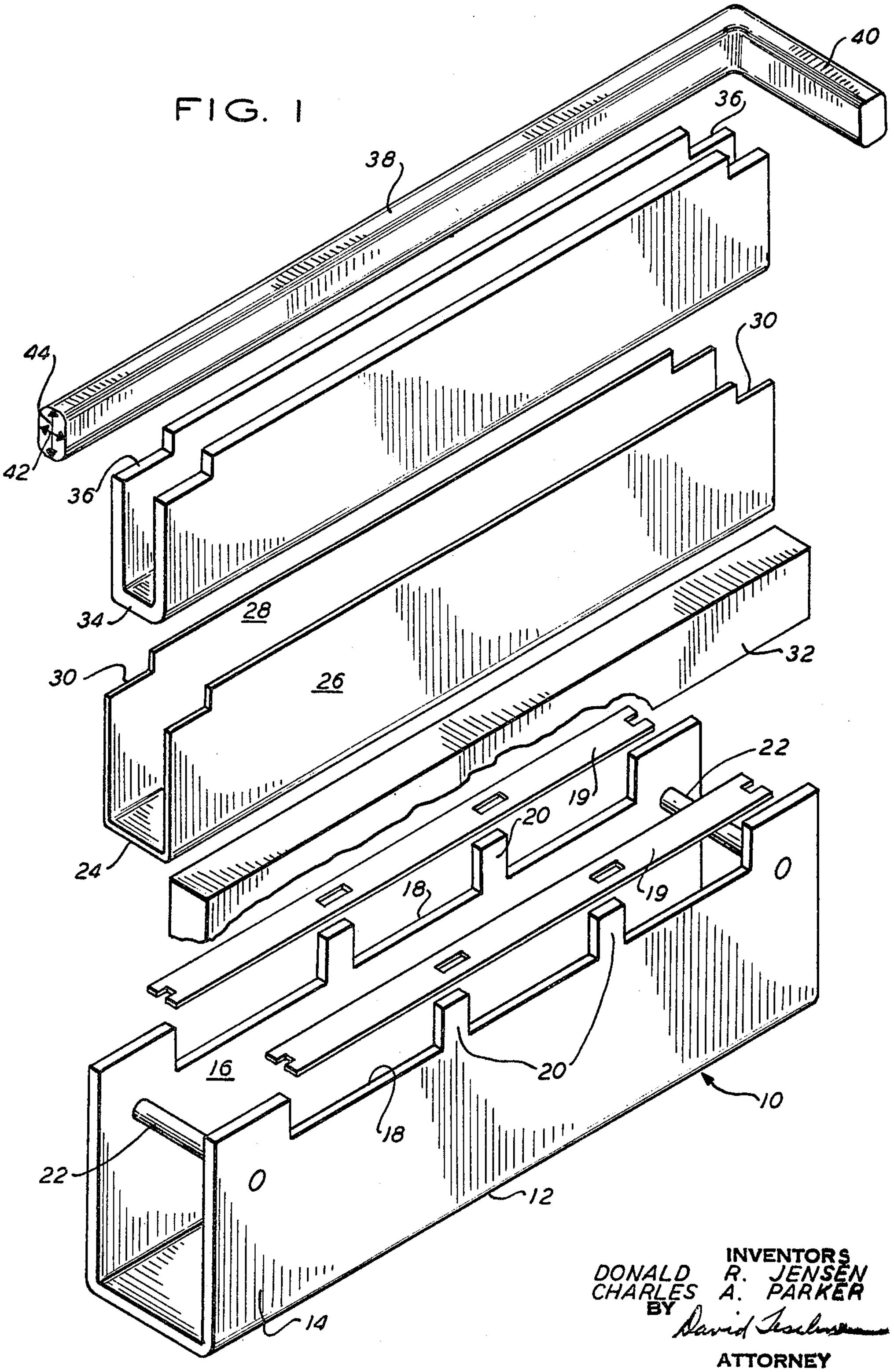
FIG. 1 is an exploded view of a connector constructed in accordance with the concepts of the invention.

Turning now to FIG. 1 there is shown an exploded view of a connector 10 constructed in accordance with the basic concepts of the invention. The connector 10 is fabricated with an outer channel 12 having a front wall 14 and a rear wall 16. The upper surfaces of the front wall 14 and rear wall 16 have placed therein a series of notches 18 which are separated from one another by the tines 20. The notches 18 will be used to position and prevent the lateral motion of a member having a plurality of electrical contacts thereon. In the preferred embodiment it is a flexible ribbon cable to be inserted within the connector 10. The tines 20 will, as described below, engage with preformed notches in the flexible ribbon cable to insure that the proper portion of the cable is inserted within the connector 10 and to provide strain relief for the cable and prevent its lateral movement or shifting during insertion or removal of another member having a plurality of electrical contacts thereon. In the preferred embodiment the second member is a printed circuit board. A retaining plate 19, havng apertures therein to match the tines 20, is placed over the flexible ribbon cable to hold it in the notches 18. This preserves the position of the cable despite removal or insertion of the printed circuit board.

At each end of the outer channel 12 there are found positioning pins 22, which, as will be described below, are used to control the position of the printed circuit board to be inserted into the connector 10. These positioning pins 22 serve to minimize or limit entirely the lateral movement of the printed circuit board and also to limit the extent of penetration of the printed circuit board as well as giving additional supporting surfaces to support the printed circuit board.

Within the outer channel 12 there is placed an inner channel 24 having a front face 26 and a rear face 28. Each of the corners of the faces 26 and 28 are notched out as shown at 30 to permit the passage of the positioning pins 22 of the outer channel 12 therethrough, once the inner channel 24 is positioned within the outer channel 12. When the inner channel 24 is positioned within the outer channel 12, the inner surface of the rear wall 16 of the outer channel 12 will be in contact with the outer surface of the back wall 28 of the inner channel 24. In this position the top edge of the back wall 28 will be below the depth of the notches 18 of the outer channel 12. The outer channel 12 is fabricated of material of greater thickness than the inner channel 24 such that the inner channel 24 is considered to be flexible whereas the outer channel 12 is semirigid. As an example of the relative thicknesses of the materials used for the inner and outer channels, the inner channel 24 may have a thickness of approximately 0.010 of an inch whereas the outer channel 12 may have a thickness in the range of $\frac{1}{32}$ of an inch. Both of these channels will be fabricated of metal or hard plastics or similar materials.

The spacing between the front face 26 of the inner channel 24 and the inner surface of the front wall 14 of the outer channel 12 may be filled with a supporting and positioning member in the form of a spacer 32 which is used to maintain a relationship between the inner channel 24 and the outer channel 12 and also to serve as a bearing and support surface for a rotatable locking bar 38 to be set forth below. The spacer 32 may be entirely eliminated by the provision of tabs cut from the surface from the front wall 14 of the outer channel 12 and bent in toward the inner channel 24 so as to maintain the inner channel 24 in its proper position and to provide the bearing and positioning surfaces for the rotatable locking bar 38 to be described below. Set within the inner channel 24 is a resilient liner 34 constructed of plastic, rubber, or similar resilient material and made to conform to the shape of the inner channel 24. In a similar fashion it will have notches 36 which correspond to the notches 30 of the inner channel 24. The resilient liner 24 will have a thickness of approximately $\frac{1}{16}$ of an inch.

Inserted between the back surface of the front wall 14 of the outer channel 12 and the front face 26 of the inner channel 24 and positioned upon the supporting and positioning member 32 is placed a locking bar 38. The locking bar 38 has a manual lever 40 arranged at one end in order to permit manual rotation of the rotatable locking bar 38. The locking bar 38 is fabricated from a basically rectangular metal stock with the corners removed so as to present a substantially elliptically shaped camming surface. The relative dimensions of the rotatable locking bar 38 are so chosen that the dimension along the minor axis 42 is quite a bit shorter than that along the major axis 44. The locking bar 38 is constructed of relatively heavy material to minimize torsional stress and to assure that it will apply the same torsional forces along its entire length when it is rotated by means of the manual lever 40. The extreme ends of the locking bar 38, at the major axis 44 are flat in shape to provide for the locking of the locking bar 38 in the operated position as will be described with reference to FIGURE 4. Thus, the camming action of the locking bar 38 generates the required forces to maintain the intimate contact between the conductors of the printed circuit board and the flexible ribbon cable during the pivoting of the connector 10 or despite the presence of disturbing vibrations which may occur during shipping or ordinary use.

Figures 6, 7, 8, 9:
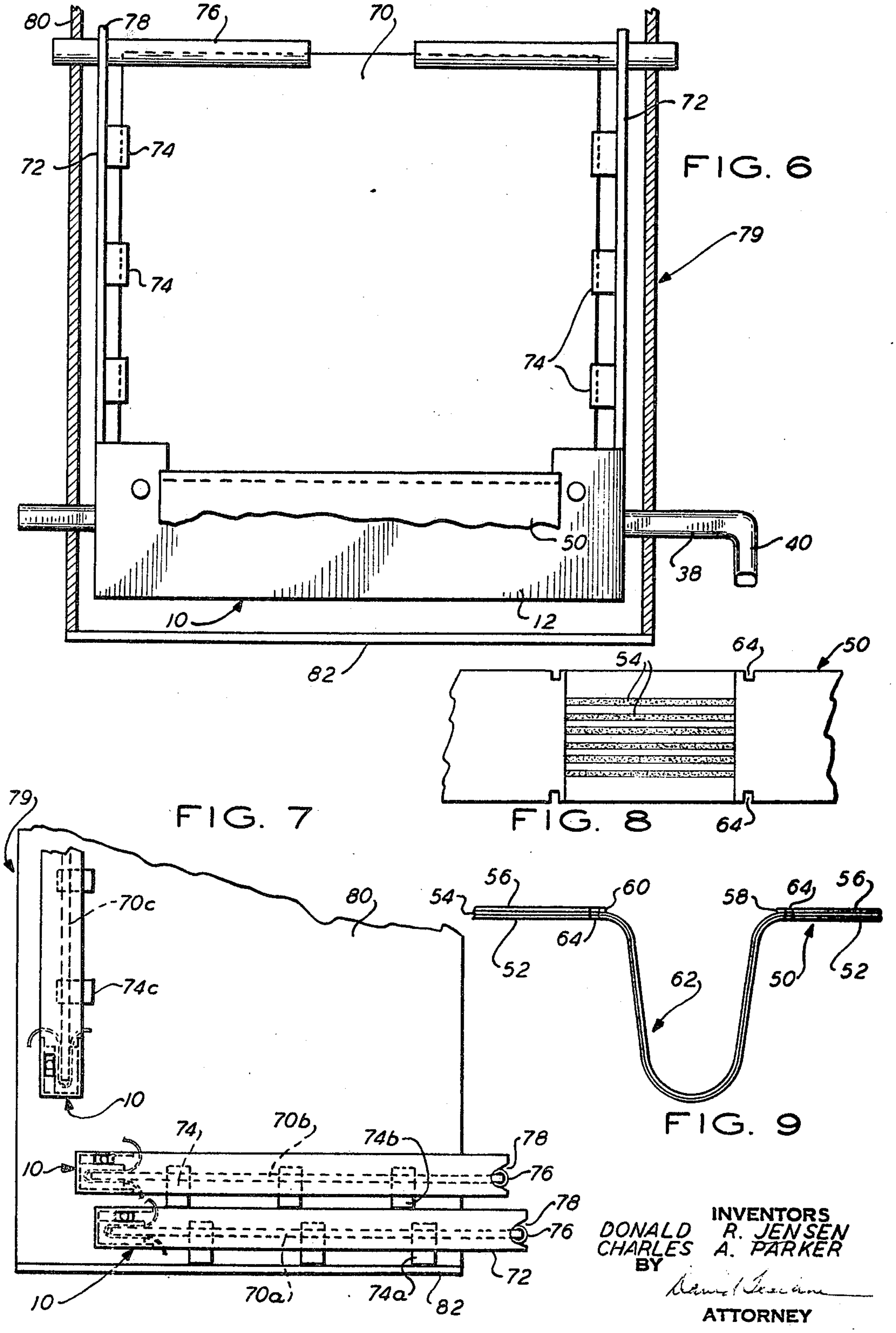
FIG. 6 shows the connector of FIG. 1 together with the supporting structure for the printed circuit board and portions of the ancillary supporting housing together with the locking mechanism for holding the printed circuit board and connector assembly to the supporting housing.
FIG. 7 is a side view of the supporting housing with the front wall removed for sake of clarity and showing a plurality of mounted printed circuit board assemblies.
FIG. 8 shows a portion of a length of flexible ribbon cable as employed in the present invention.
FIG. 9 is a side view of a portion of the flexible ribbon cable conformed to the shape necessary for insertion into the connector of FIG. 1.

Turning now to FIGS. 8 and 9, there is shown a portion of a flexible ribbon cable 50 showing its details of construction and the manner in which it is formed for use with the connector 10 of FIG. 1. As shown in FIG. 9, which is a side elevation of a portion of the flexible ribbon cable 50, the cable 50 is constructed of a basic supporting and insulating layer 52 upon which is placed a number of individual electrical conductors 54 which may be made of thin strands of copper wire or which may be deposited copper or other conducting materials chemically deposited by means of vapor deposition or other similar well-known techniques. Atop the conductors 54 there is placed a second protective and insulating layer 56. The top insulating layer 56 is interrupted at the points 58 and 60 to expose the individual conductors 54 in the area generally designated 62.

Notches, such as those at 64, are provided in the flexible ribbon cable 50, outside of the conductor 54 area, at points prior to the exposed areas of the conductors 54, that is before the points 58 and 60 which define the beginnings of the exposed conductor area 62. As shown in FIG. 9 the flexible ribbon cable 50 is formed into a loop for insertion within the resilient liner 34 in the inner channel 24 and for insertion of the printed circuit board within the loop so as to contact the individual conductors 54 within the exposed conductor area 62.

Figures 2, 3, 4, 5:
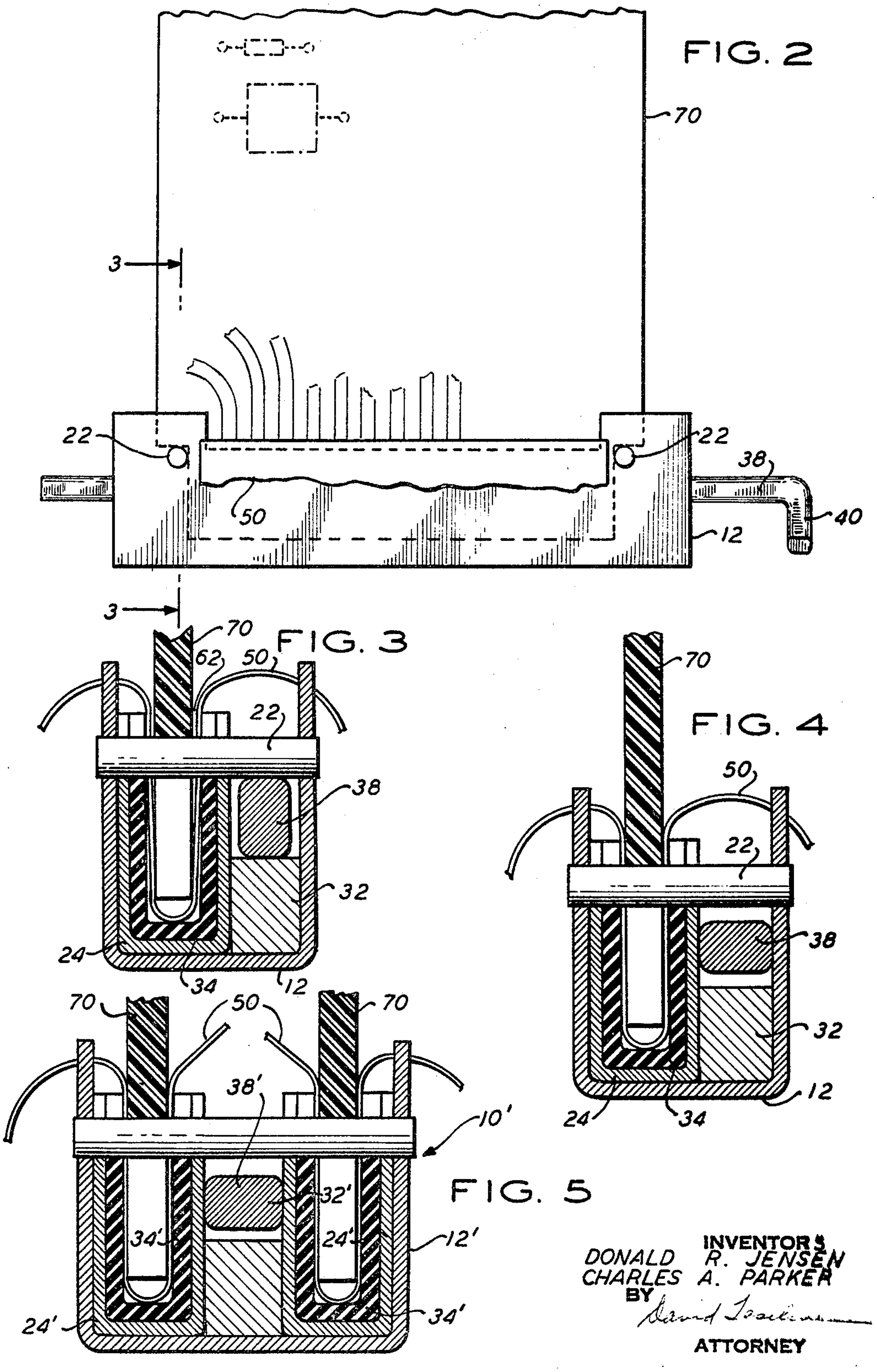
FIG. 2 is a front elevation of the connector with a printed circuit board and flexible ribbon cable inserted therein.
FIG. 3 is a sectional view of the connector and assembled printed circuit board and flexible ribbon cable taken along the line 3—3 of FIG. 2.
FIG. 4 is a further view of FIG. 3 showing the relationship of the component portions in their operated condition.
FIG. 5 shows a further embodiment of the connector constructed in accordance with the basic concepts of the invention.

Turning now to FIG. 2 there is shown an assembled connector 10 with a printed circuit board 70 inserted within the exposed conductor area 62 (note FIG. 9) with the entire unit, composed of the printed circuit board 70 and the flexible ribbon cable 50 inserted within the resilient liner 34 in the inner channel 24. The printed circuit board 70 rests on the positioning pins 22 to limit the penetration of the printed circuit board 70 into the connector 10 and prevent the lateral shifting of the printed circuit board 70 with respect to the connector 12. The locking bar 38 is shown in its nonoperated position, that is where no pressure is exerted between the outer channel 12 and the inner channel 24 and the printed circuit board 70 and the flexible ribbon cable 50.

Turning now to FIG. 3 there is shown a portion of the assembled unit of FIG. 2 taken along the line 3—3 of FIG. 2. From the sectional view of FIG. 3, it can be seen that the printed circuit board 70 is fed into the loop area 62 of the flexible ribbon cable 50 and that the printed circuit board 70 and the flexible ribbon cable 50 has been inserted within the resilient liner 34 of the inner channel 24. The inner channel 24 has in turn been inserted within the outer channel 12 and the spacer 32 supports the rotatable locking bar 38 in its nonoperated position. The positioning pin 22 serves, as stated above, to limit the penetration of the printed circuit board 70 into the flexible ribbon cable 50 as well as limiting the movement of the printed circuit board 70. The notches 64, in the flexible ribbon cable 50, are made to mate with the tines 20 and to fit within the notches 18 of the outer channel 12 at both the front wall 14 and the rear wall 16. The locking bar 38 is shown in its nonoperated position, that is, with its minor axis 42 positioned across the space formed between the front face 26 of the inner channel 24 and the inner surface of the front wall 14 of the outer channel 12. In this position it is possible to readily insert or remove the printed circuit board 70 or the combination of the printed circuit board 70 together with the flexible ribbon cable 50. In practice, the width of the inner channel 24 as well as the sides of the rubber liner 34 will be such, that upon insertion of the printed circuit board 70 with the flexible ribbon cable 50 a slight wiping action will take place to remove surface dirt and oxides from the individual conductors of the printed circuit board 70 and the individual conductors 54 of the flexible ribbon cable 50.

Turning now to FIG. 4 there is shown the same connector 10 arrangement as is seen in FIG. 3 but with the rotatable locking bar 38 rotated to its operative position, that is with its major axis 44 extending across the space between the front face 26 of the inner channel 24 and the inside surface of the front wall 14 of the outer channel 12. Due to this action a uniform force will be exerted along the length of locking bar 38 which will force against the front face 26 of the inner channel 24 and in turn cause the compression of the resilient liner 34. The resilient liner 34 is so selected and dimensioned such that it will be able to absorb minor variations in the thickness of the flexible ribbon cable 50 as well as variations in the thickness of the printed circuit board 70 conductors. Flexible inner channel 24 will be responsible for transmitting in a uniform manner the force exerted by means of the rotated locking bar 38. In addition, the semirigid outer channel 12 will provide some degree of spring loading effect and averaging of the force presented by the rotation of the locking bar 38 by means of its own flexure. For example, if a rigid channel were used for the outer channel 12 and the printed circuit board 70 was badly warped it might not be possible to completely rotate the locking bar 38 or, in the alternative, if the rotating locking bar 38 were completely rotated the board 70 might be cracked thereby. The thickness of the resilient liner 34 could be increased to take care of such extreme cases of printed circuit board warpage. However, the ability to control the compression of the resilient liner 34 would be greatly reduced. The combined effects of the resilient liner 34, the flexibility of the inner channel 24, and the semiflexibility of the outer channel 12, in combination with the rotation of the rotatable locking bar 38, permits an even distribution of force along the entire length of the connector 10 regardless of its length. It also tends to even out variations and the degree of rotation of the bar 38 along its length, which might occur in a long locking bar 38, or for machining errors which tend to alter the contour of the locking bar 38 along its length. In addition, it tends to compensate for variations in the thickness or flexibility of both the resilient liner 34 and the inner channel 24.

Turning now to FIG. 5, there is shown a dual connector arrangement 10′ whereby within a single outer channel 12′ there are provided two inner channels 24′ each of which is lined with a resilient liner 34′ and arranged to receive printed circuit boards 70 together with flexible ribbon cables 50. The single locking bar 38′, arranged to fit and rest upon a support member 32′, is arranged to permit the locking or unlocking of the connector 10′ in the same manner as that described with reference to FIGS. 3 and 4, and, therefore, no further descriptions of FIGURE 5 will be given. It also will be possible to extend this to a number of units such as that shown in FIGS. 3 and 5 and to have them operated by a common manual lever such that all of the rotatable locking bars coupled thereto are rotated at the same time.

FIG. 6 shows the manner in which the connector 10 may be assembled into a support housing 79 together with individual support members for the printed circuit board 70. Connected to the extremes of the outer channel 12 are two support members 72, each of which has connected along its length a series of supports 74. Each of the supports 74, as will be shown in greater detail with respect to FIG. 7, forms a channel through which the printed circuit board 70 may be passed upon insertion or removal from the connector 10. The support members 72, thus serve to support the printed circuit board 70 along its length and to prevent the board 70 from being damaged or bending as a result of its own weight or the components thereon. An additional set of locking pins 76, in the form of small channels, are provided along the top of the printed circuit board 70 and are movable within a notch 78 (see FIG. 7) in the support members 72, into an aperture within the supporting housing 79 side wall 80. The rotatable locking bar 38 is extended in such a manner as to fit into further apertures within the supporting housing 79 side walls 80 such as to act as pivots for the support 72. In order to permit the rotation of the printed circuit board 70 from the position shown in FIG. 6, which is assumed to be the position it occupies during usage, to a position perpendicular with respect to the plane of FIG. 6 (as better shown in FIG. 7) for servicing the back portion of the board 70, the slidable locking pins 76 are slid toward the center of the printed circuit board 70 removing them from the apertures in the supporting housing 79 side walls 80. The board 70 is then free to be rotated by hand to a downward position such that it contacts the base 82 of the supporting housing 79 or the next adjacent printed circuit board 70 as will be explained in greater detail with respect to FIG. 7. It should be noted that each of the supports 74 contain tabs **74*a* and 74*b* perpendicular to the plane of the drawings (better shown in FIG. 7) which tabs 74*a* and 74*b* will act as a rest for contact of the lowest board with respect to the base 82 of the support housing 79 or as a spacer between respective boards 70** when in the rotated position to prevent contact between the components thereof and possible destruction of the circuits involved.

Turing now to FIG. 7, there is shown a view of the supporting housing 79 for housing a plurality of printed circuit boards 70. The housing 79 has a back wall 80 with a similar front wall 80 removed, and a base 82. Three connectors 10, together with their associated printed circuit board **70*a*, 70*b* and 70*c* and their support members 72 are shown assembled into the supporting housing 79. This is not intended in any way to limit the scope of the invention in that any number of boards 70 and connectors 10 may be employed providing sufficient space is made available in the supporting housing 79. Considering the lowest of the three boards 70*a* shown, its supporting member 72 is shown to have a notch 78, as was described briefly above. Further, each of the supports 74 has a tab such as 74*a* which is used as a rest to support the printed circuit board 70*a* in proper relationship with the base 82 of the supporting housing 79. As can be seen with respect to the second of the two printed circuits boards 70*b* in the position extending horizontally in FIGURE 7, the tabs 74*b* of board 70*b* are used to provide the propjer spacing between board 70*a* and board 70*b* to prevent possible contact and shorting or damage of the components on the respective boards. Locking pins 76 can be seen in FIGURE 7 to be channel-shaped such as to be able to slide along the top surface of the printed circuit board 70 and are shown in their retracted position. It will be assumed for the printed circuit board 70*c* and connector 10** shown in the vertical position to the left of FIGURE 7 that this is properly locked in position in the manner described with respect to FIG. 6.

From the foregoing explanations, it should be obvious that the multipurpose coupling device described herein provides a simple, small, readily operable device providing for the connection between a printed circuit board and a plural conductor flexible ribbon cable as well as providing supporting framework for the printed circuit board, pivotal means for allowing its mounting within a housing and further means to support it with respect to the housing and with respect to other boards and to provide for the locking of the board in a position with respect to the housing. All this is accomplished with a minimum amount of hardware which permits a maximum flexibility of operation. It should also be evident that rather than requiring the rewiring of connectors for each change in printed circuit board configuration as is necessary in prior art devices, it is only necessary that the flexible ribbon cable 50 be changed to conform to the new printed circuit board 70 to be employed. Thus, many hours of involved wiring and checkout can be readily avoided.

While there have been shown and described and pointed out the fundamental novel features of the invention as applied to the preferred embodiment, it may be understood that various omissions and substitutions and changes of the form and details of the device illustrated and its operation may be made by those skilled in the art, without departing from the spirit of the invention.

The embodiments of the invention in which the exclusive property or privileges claimed are defined as follows:

1. A multipurpose coupling device for coupling the conductors of multiconductor members comprising:

an outer housing having walls forming a first space therebetween;

a flexible inner housing having walls forming a second space therebetween proportioned to fit within said first space of said outer housing and provide a third space between one of said walls of said inner housing and one of said walls of said outer housing; and a rotatable locking bar means having at least first and second crosss-sectional dimensions, one of said dimensions being larger than the other, said locking bar means positioned in said third space for coacting with said one wall of said inner housing and said one wall of said outer housing, said locking bar means, when rotated to have its first cross-sectional dimension across said third space, permitting the insertion or removal of said members within said inner housing, said locking bar means, when rotated to have its second cross-sectional dimension across said third space, preventing the insertion or removal of said members from said inner housing and causing intimate contact between at least a pair of said conductors of said members, said contact being caused by the flexure of said inner housing caused by said locking bar means being rotated to its second cross-section dimension.

2. A multipurpose coupling device as defined in claim 1, wherein said flexible inner housing is arranged to receive a plurality of multiconductor printed circuit boards and a plurality of associated multiconductor flexible ribbon cables.

3. A multipurpose coupling device as defined in claim 1, including resilient means placed within said second space of said inner housing to line at least one inner wall thereof, said members being inserted within said second space adjacent said resilient means.

4. A multipurpose coupling device as defined in claim 3, said outer housing forming an outer channel defined in part by said first space and said walls of said outer housing, said inner housing forming an inner channel defined in part by said second space and said walls of said inner housing.

5. A multipurpose coupling device as defined in claim 4 wherein:

said members include a printed circuit board and a flexible ribbon cable;

an additional flexible inner channel for coupling said conductors of said printed circuit board to associated conductors of said flexible ribbon cable, said additional inner channel proportioned to fit within said outer channel and provide a fourth space between said one wall of said inner channel and said one wall of said additional inner channel;

additional resilient means spaced between said inner channel and conforming to the shape of said additional inner channel;

said rotatable locking bar means positioned in said fourth space, between said inner channel and said additional inner channel, for coacting with said one wall of said inner channel and said one wall of said additional inner channel;

said locking bar means when rotated to have its first cross-sectional dimension across said fourth space permitting the insertion or removal of said printed circuit boards together with said flexible ribbon cables within said resilient means and said additional resilient means, said locking bar means when rotated to have its second cross-sectional dimension across said space preventing the insertion or removal of said printed circuit boards and said flexible ribbon cables from said resilient means and said additional resilient means and causing intimate contact between at least one individual conductor of said printed circuit boards and at least one associated individual conductor of said flexible ribbon cables, said contact being caused by flexure of said one wall of said inner channel and said one wall of said additional inner channel and the compression of said resilient means and said additional resilient means.

6. A multipurpose coupling device as defined in claim 4, further including positioning support means disposed in said third space between said one wall of said inner channel and said one wall of said outer channel, said positioning support means supporting and positioning said locking bar means substantially adjacent the upper portion of said one wall of said inner channel.

7. A multipurpose coupling device as defined in claim 6 wherein said members include a printed circuit board and a flexible ribbon cable, said coupling device further including positioning pins near the limits of said outer channel, said positioning pins extending from said one wall to a second wall of said outer channel for limiting the depth of insertion and the lateral movement of said printed circuit board and said flexible ribbon cable within said coupling device.

8. The multipurpose coupling device as defined in claim 1, wherein said walls of said outer housing are notched at positions intermediate the limits of said outer housing and at substantially the upper portion of said walls, said notches accepting said members for positioning and limiting the lateral movement thereof.

9. A multipurpose coupling device as defined in claim 1 wherein said outer housing has notches therein, at least one of said members is notched at positions along said one member at points prior to the entry of said inner housing and after the exit from said inner housing, said one member notches coacting with said outer housing notches whereby movement of said one member within said coupling device is prevented and proper positioning of said one member within said coupling device is assured.

10. A multipurpose coupling device as claimed in claim 1, further including:

first and second support frames coupled to said outer housing and extending in parallel with the lateral edges of one of said members, said one member being a printed circuit board; and mounting members coupled to said first and second support frames to provide guides for the insertion and removal of said printed circuit board with respect to said inner housing and provide support for said printed circuit board when inserted in said inner housing, said mounting members also providing resting points for said printed circuit board to prevent contact between components or connections upon said board with adjacent boards or further supporting structure.

11. A multipurpose coupling device as defined in claim 10, having a further supporting housing including slidable locking means mounted along the top edge of said printed circuit board to cooperate with said support frames.

12. A multipurpose coupling device as defined in claim 11 further including supporting structure for supporting and housing said coupling device and at least one of said members, said one member being a printed circuit board;

said supporting structure having a base and at least one side wall;

said side wall having a first aperture to receive said locking bar means of said coupling device, to permit said locking bar means to operate as a pivot, and to permit said coupling device and said members to rotate with respect to said supporting housing whereby access may be had to both sides of said printed circuit board;

said resting points limiting the rotation of said printed circuit board with respect to said support housing base;

said side wall having a second aperture to receive said slidable locking means and prevent the rotation of said printed circuit board when in a first position and permit the rotation of said printed circuit board when in a second position.

13. A multipurpose coupling device as defined in claim 12, wherein said supporting structure having first and second spaced housing side walls, said side walls have a plurality of first apertures to receive the locking bar means of a plurality of said coupling devices, said first apertures being so positioned so as to permit rotation of individual ones of said coupling devices without interference with others of said coupling devices; said supporting structure first and second housing side walls further having a plurality of second apertures to receive said slidable locking means of said printed circuit boards.

References Cited

UNITED STATES PATENTS

| | | | |
|---|---|---|---|
| 3,102,767 | 9/1963 | Schneck. | |
| 3,114,587 | 12/1963 | Herrmann. | |
| 3,158,421 | 11/1964 | Hansenauer. | |
| 3,243,762 | 3/1966 | Tammburro | 339—176 |

DAVID J. WILLIAMOWSKY, Primary Examiner

PHILIP C. KANNAN, Assistant Examiner

U.S. Cl. X.R.

339—176, 17